United States Patent
Weber et al.

(10) Patent No.: US 12,328,949 B2
(45) Date of Patent: Jun. 10, 2025

(54) LARGE CAPACITOR PRE-CHARGE METHOD AND CIRCUIT

(71) Applicant: CASCO PRODUCTS CORPORATION, Novi, MI (US)

(72) Inventors: Charles Weber, Novi, MI (US); Mikhail Aronson, Novi, MI (US)

(73) Assignee: CASCO PRODUCTS CORPORATION, Novi, MI (US)

( * ) Notice: Subject to any disclaimer, the term of this patent is extended or adjusted under 35 U.S.C. 154(b) by 664 days.

(21) Appl. No.: 17/633,237

(22) PCT Filed: Aug. 10, 2020

(86) PCT No.: PCT/US2020/045565
§ 371 (c)(1),
(2) Date: Feb. 7, 2022

(87) PCT Pub. No.: WO2021/026519
PCT Pub. Date: Feb. 11, 2021

(65) Prior Publication Data
US 2022/0285340 A1    Sep. 8, 2022

Related U.S. Application Data

(60) Provisional application No. 62/884,340, filed on Aug. 8, 2019.

(51) Int. Cl.
*H01L 29/78*   (2006.01)
*H10D 89/60*   (2025.01)

(52) U.S. Cl.
CPC ......... *H10D 89/911* (2025.01); *H10D 89/711* (2025.01); *H10D 89/819* (2025.01)

(58) Field of Classification Search
CPC ............ H01L 27/0288; H01L 27/0259; H01L 27/0285; H02M 1/322; H02M 1/36; H02J 7/345; H03K 17/08122; H03K 17/166
(Continued)

(56) References Cited

U.S. PATENT DOCUMENTS 9,184,655 B2 * 11/2015 Drda .................. H02M 1/36
9,584,027 B2 *  2/2017 Polivka ............ H02M 3/33507
(Continued)

OTHER PUBLICATIONS

International Search Report mailed Oct. 29, 2020 in corresponding PCT International Application No. PCT/US2020/045565.
(Continued)

*Primary Examiner* — Vu A Vu
(74) *Attorney, Agent, or Firm* — OSTROLENK FABER LLP

(57) ABSTRACT

A method of operating a circuit having a capacitor and a load that are connectable to, and disconnetable from, a voltage source by an electronically controllable switch, the method includes charging the capacitor by raising a voltage across the capacitor from an initial voltage value and at a constant rate by controlling the switch to supply current to the capacitor at a constant current supply rate that is selected to avoid damage to the switch, and then operating the switch to supply current from the voltage source to the capacitor when the voltage across the capacitor reaches the voltage source's voltage.

13 Claims, 6 Drawing Sheets

(58) Field of Classification Search
USPC ........................................................ 257/355
See application file for complete search history.

(56) References Cited

U.S. PATENT DOCUMENTS

| | | | |
|---|---|---|---|
| 9,590,515 B2* | 3/2017 | Uchihara | B60L 3/003 |
| 9,778,289 B2* | 10/2017 | Dearborn | H02M 3/158 |
| 10,278,258 B2* | 4/2019 | Ido | H05B 47/25 |
| 11,031,933 B2* | 6/2021 | Lueders | H02M 3/33592 |
| 2005/0035729 A1 | 2/2005 | Lev et al. | 315/291 |
| 2012/0113687 A1 | 5/2012 | Wildrick | 363/210.02 |
| 2014/0085938 A1 | 3/2014 | Shi et al. | 363/21.01 |
| 2016/0149515 A1 | 5/2016 | Sicard | |
| 2016/0285273 A1 | 9/2016 | Leinonen et al. | |
| 2017/0317582 A1 | 11/2017 | Leong et al. | |
| 2021/0075312 A1* | 3/2021 | Yoshida | H02J 7/00714 |

OTHER PUBLICATIONS

Written Opinion mailed Oct. 29, 2020 in corresponding PCT International Application No. PCT/US2020/045565.

* cited by examiner

LARGE CAPACITOR PRE-CHARGE METHOD AND CIRCUIT

CROSS-REFERENCE TO RELATED APPLICATIONS

The present application is a 35 U.S.C. §§ 371 national phase conversion of International Application No. PCT/U.S.2020/045565, filed Aug. 10, 2020, which claims priority to U.S. patent application Ser. No. 62/884,340, filed Aug. 8, 2019, the contents of both of which are incorporated herein by reference. The PCT International Application was published in the English language.

FIELD OF INVENTION

The present invention relates to a method for charging a capacitor and a circuit for implementing the method.

BACKGROUND

Referring to FIG. 1, inputs to power converters, inverters and other devices can have a solid state disconnect cut-off switch (S1), which is used to shut down the load (C1 and RL1 and the control block) by disconnecting the load from the voltage source (V1). There are many reasons for a disconnection, which are not discussed here. The switch (S1) is typically a controllable device such as a MOSFET or a BJT (bipolar junction) transistor.

Some loads can have a large capacitive property. In this case, a sudden connection of the capacitive load (capacitor (C1)) to the voltage source (V1) via switch (S1) will cause a large transient switch current from the switch (1) while charging the capacitive load (capacitor (C1)). This large current can damage the solid-state switch (S1). This problem is not new.

Referring to FIG. 2, one way to solve this problem is to add a second pre-charge switch (S_pre-charge) in series with a pre-charge resistor (R_pre-charge) to limit the current while pre-charging capacitor (C1) with the switch (S1) open. After charging the capacitor (C1) via the pre-charge switch (S-pre-charge) and the pre-charge resistor (R_pre-charge), the switch (S1) is closed to connect the capacitor (C1) directly to the voltage source (V1) for normal operation. The drawback to this solution is the additional length of time needed to charge the capacitor (C1) due to the RC exponential response for the pre-charge resistor (R_precharge) and the capacitor (C1).

SUMMARY

It is an object of the present invention to provide a method to address the problem described in the background.

A method according to the present invention operates a circuit that includes a capacitor and a load that are connectable to, and disconnetable from, a voltage source by an electronically controllable switch.

The method includes charging the capacitor by raising a voltage across the capacitor from an initial voltage value and at nearly a constant rate by controlling the switch to supply current to the capacitor at approximately a constant current supply rate that is selected to avoid damage to the switch, and then operating the switch to supply current from the voltage source to the capacitor when the voltage across the capacitor reaches the voltage source's voltage.

The recitation "nearly constant" or "approximately constant" as used in the application are meant to cover the intended constant rate and the unintentional variation or the unintentional divergence from the intended constant rate caused by, for example, the specific components of the circuit and/or the testing equipment used to measure the rate.

The switch may be a bipolar junction transistor.

The switch may be a MOSFET. If the switch is a MOSFET, the gate to ground voltage of the MOSFET is increased according to a predetermined dV/dt rate to supply current to the capacitor.

The circuit may further have a Reference dV/dt block connected to increase the gate to ground voltage according to the predetermined dV/dt rate.

The method may further include comparing the gate to source voltage of the MOSFET (Vgs) to a reference voltage, and disabling the Reference dV/dt block when the Vgs reaches a reference voltage (Vref). To carry out the comparing step, a comparator may be provided to compare the Vgs to a Vref and to disable the Reference dV/dt block when the Vgs reaches the Vref.

The method may further include increasing the Vgs to a full-on voltage (Von) after disabling the Reference dV/dt block.

In one embodiment, the Vgs may be increased by a pull-up resistor connected to another voltage source.

The method may further include disconnecting the voltage source from the capacitor and the load by disabling the MOSFET. For example, the method may include operating a disconnection switch to divert current away from the gate of the MOSFET to disable the MOSFET and disconnect the voltage source from the capacitor and the load. In this example, the current may be diverted away from the another voltage source to the capacitor.

Other features and advantages of the present invention will become apparent from the following description of the invention which refers to the accompanying drawings

DETAILED DESCRIPTION

To speed up the pre-charge time for the capacitor (C1) while maintaining a well-controlled safe level of current through the solid-state switch (S1) current is supplied from the switch (S1) to the capacitor (C1) in a controlled manner as described below.

The controlled charging of the capacitor (C1) is based on two physical properties. First, the current into (drawn by) the capacitor (C1) is represented by I=C*dV/dt. This means that if the rate of change of voltage across the capacitor (C1) is held to a constant, then the current entering the capacitor (C1) will also be constant. Second, at any given drain (or collector) current, the Vgs (or Vbe if a BJT is used) of switch (s) is also nearly constant.

Figure 1:
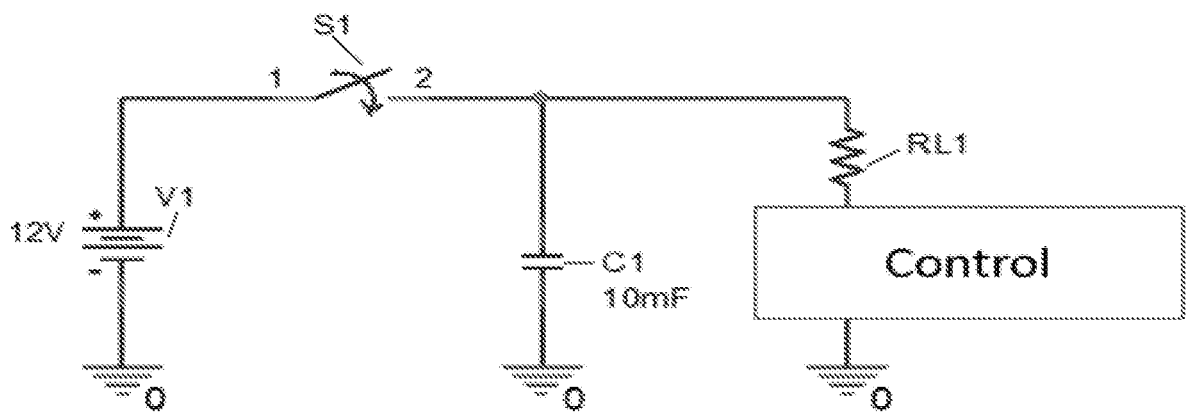
FIG. 1 shows a circuit according to the prior art.
Figure 2:
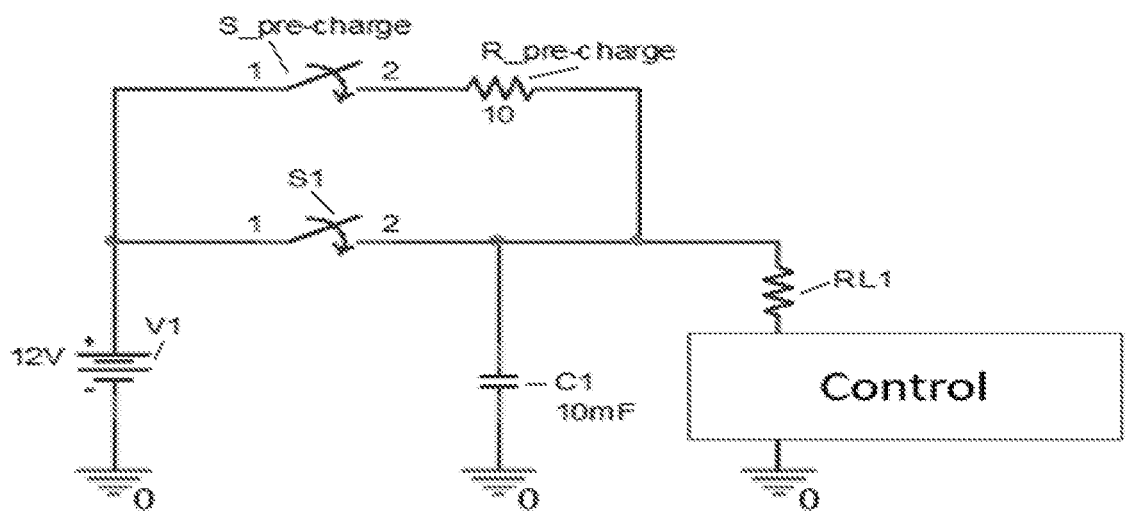
FIG. 2 shows another circuit according to the prior art.
Figure 3:
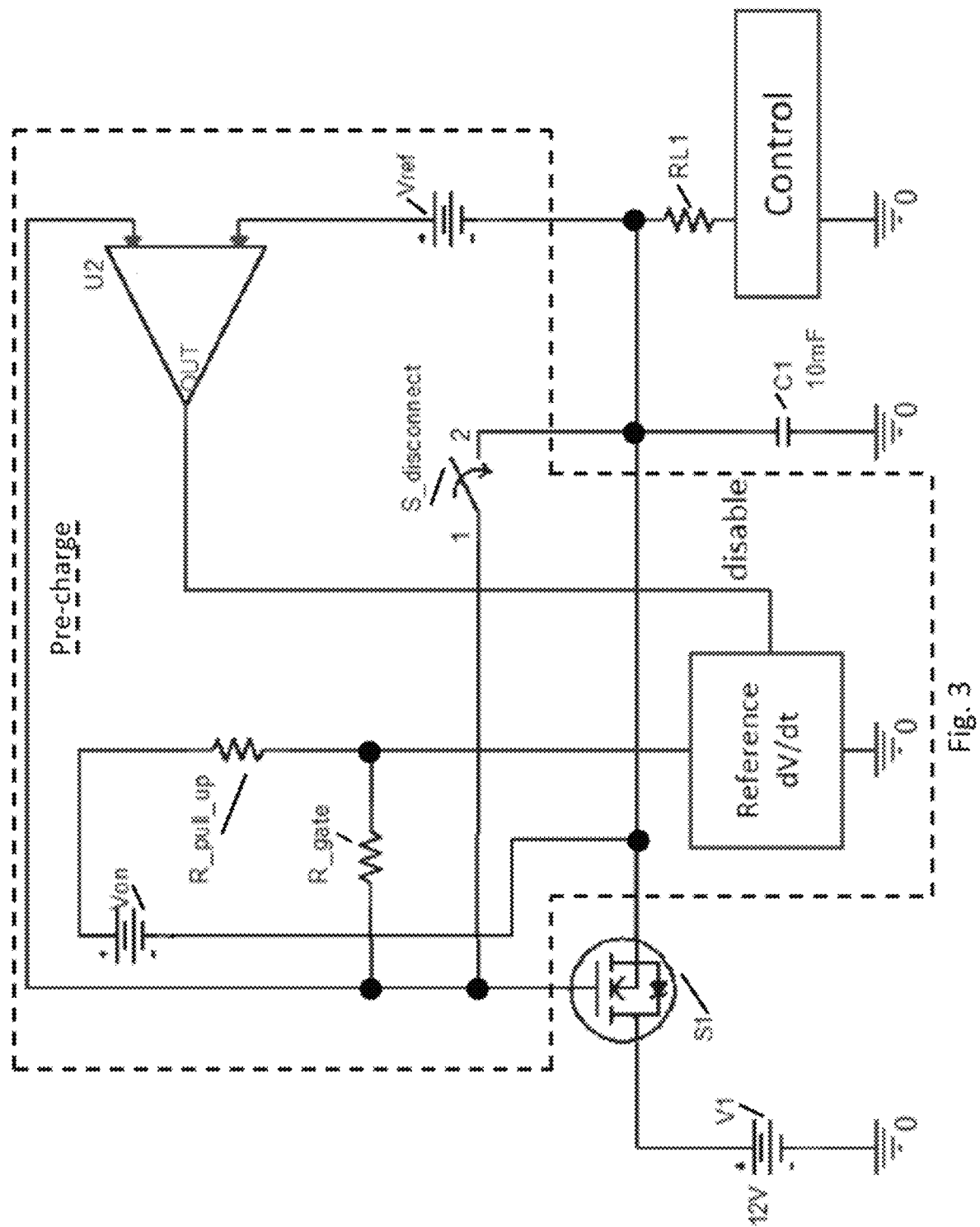
FIG. 3 shows a circuit that includes a pre-charge circuit for implementing a method according to the present invention.

The circuit shown in FIG. 3 includes a pre-charge circuit (Pre-charge) that controls the charging of capacitor (C1) with a well-controlled, constant current (or nearly or approximately constant current) from the switch (S1).

In the example of FIG. 3, the switch (S1) is a MOSFET. A BJT would also work as the switch (S1).

The Reference dV/dt block in FIG. 3 includes an input to disable/enable its dV/dt function. When enabled, the Reference dV/dt block affects the gate voltage of switch (S1) as described below. When disabled, the Reference dV/dt block no longer has influence over the gate voltage of the switch (S1). During charging, the Reference dV/dt block sets the dV/dt of the switch (S1) gate relative to the ground node 0.

In the circuit of FIG. 3, a Comparator (U2) compares the Vgs of the switch (S1) (gate to source of voltage of S1) to a reference voltage (Vref) and disables the Reference dV/dt block when the Vgs exceeds the reference voltage (Vref). At the beginning of the capacitor (C1) charging cycle, the initial voltage of the Reference dV/dt block is below the Vgs threshold voltage of the switch (S1).

In the circuit of FIG. 3, a disconnect switch (S_disconnect), is open during pre-charging, and is available, by closing, to permit a quick disconnection of the capacitor (C1) and the load (RL1) from the voltage source (V1).

The pull-up resistor (R_pull_up) and the gate voltage source (Von) of the circuit of FIG. 3 set the gate voltage of the switch (S1) to fully turn on the switch (S1) when the controlled dV/dt is disabled.

The circuit shown in FIG. 3 includes a pre-charge circuit (Pre-Charge) that functions as set forth below.

At initial time (t=0), the capacitor (C1) is at 0V, and the Vgs of the switch (S1) is also at 0V. At this point, the Reference dV/dt block is enabled and the Vgs of the switch (S1) is raised by the Reference dV/dt via the resistor (R-gate) according to the predetermined rate of dV/dt generated by the Reference dV/dt.

The disconnect switch (S_disconnect), when closed, drives the gate voltage (Vg), relative to the source voltage (Vs) and V24_S (this is the same node), to zero volts.

At t<0, the disconnect switch (S_disconnect) is closed and at t=0, the disconnect switch (S-disconnect) opens. Also, at t<0, the disconnect switch (S_disconnect) initializes the voltage on the reference dV/dt to be equal to the arbitrary voltage of the capacitor (C1). The Reference dV/dt is between Vg (via R-gate) and ground. Of course, zero and the initialization of dV/dt reference starting voltage is limited by the capability of the components and their variation.

This means the initial voltage state of capacitor (C1) is an arbitrary voltage, the switch (S1) is shut off at t<0 and the pre-charge cycle can be started at the arbitrary initial voltage condition of the capacitor (C1) when the disconnect switch (S_disconnect) opens at t=0.

When the Vgs of the switch (S1) reaches an incremental voltage above the Vgs threshold voltage, the current flows through the switch (S1) from the voltage source (V1) and enters the capacitor (C1).

Because the Reference dV/dt block is increasing the Vgs of the switch (S1) at the same predetermined rate, and because the Vgs is approximately constant, the dV/dt across the capacitor (C1) is also constant.

Because the dV/dt across capacitor (C1) is constant, the current entering the capacitor (C1) is constant and the current in the drain of the switch (S1) is constant.

By design, the constant drain current of the switch (S1) is at a safe and controlled value to avoid damaging the switch (S1) while the capacitor (C1) is charging.

Eventually, in a short time, the voltage at the capacitor (C1) will be approximately equal to voltage of the voltage source (V1). At this time, the drain current of the switch (S1) will cease and the Vgs of the switch (S1) will continue to rise according to the Reference dV/dt block.

When the Vgs of the switch (S1) reaches the Vref of the comparator (U2), the output of the comparator (U2) disables the Reference dV/dt block. This releases the gate of the switch (S1) from the influence (control) of the Reference dV/dt block.

Without the influence of the Reference dV/dt block, the Vgs of the switch (S1) will rapidly rise to the voltage of the voltage source (Von) via the pull-up resistor (R_pull-up). At this time, the capacitor (C1) is charged and the switch (S1) is fully on and ready for operating on the load (RL1) as required by the module function.

In the circuit of FIG. 3, the switch (S1) may disconnect the load (RL1) from the voltage source (V1) suddenly by the closing of the disconnect switch (S_disconnect) to reduce the gate voltage of the switch (S1) to below the threshold gate voltage by diverting current away from the voltage source (Von) away from the gate of the switch (S1).

Figure 4:
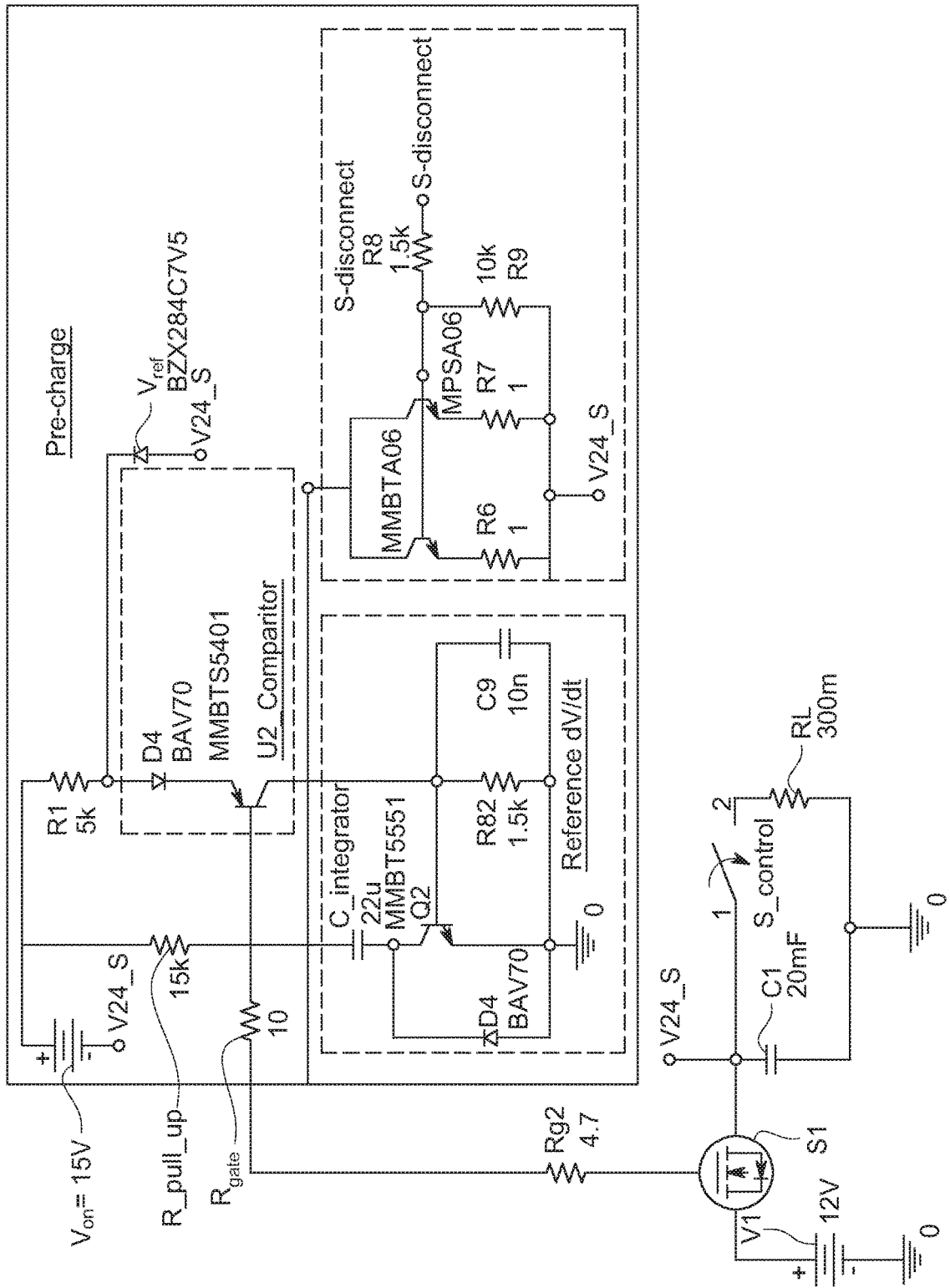
FIG. 4 shows a specific example of a circuit for implementing a method according to the present invention with functional blocks of FIG. 3 labeled.

FIG. 4 shows a specific example of the pre-charge circuit (Pre-charge) for implementing a method according to the present invention.

Figure 5:
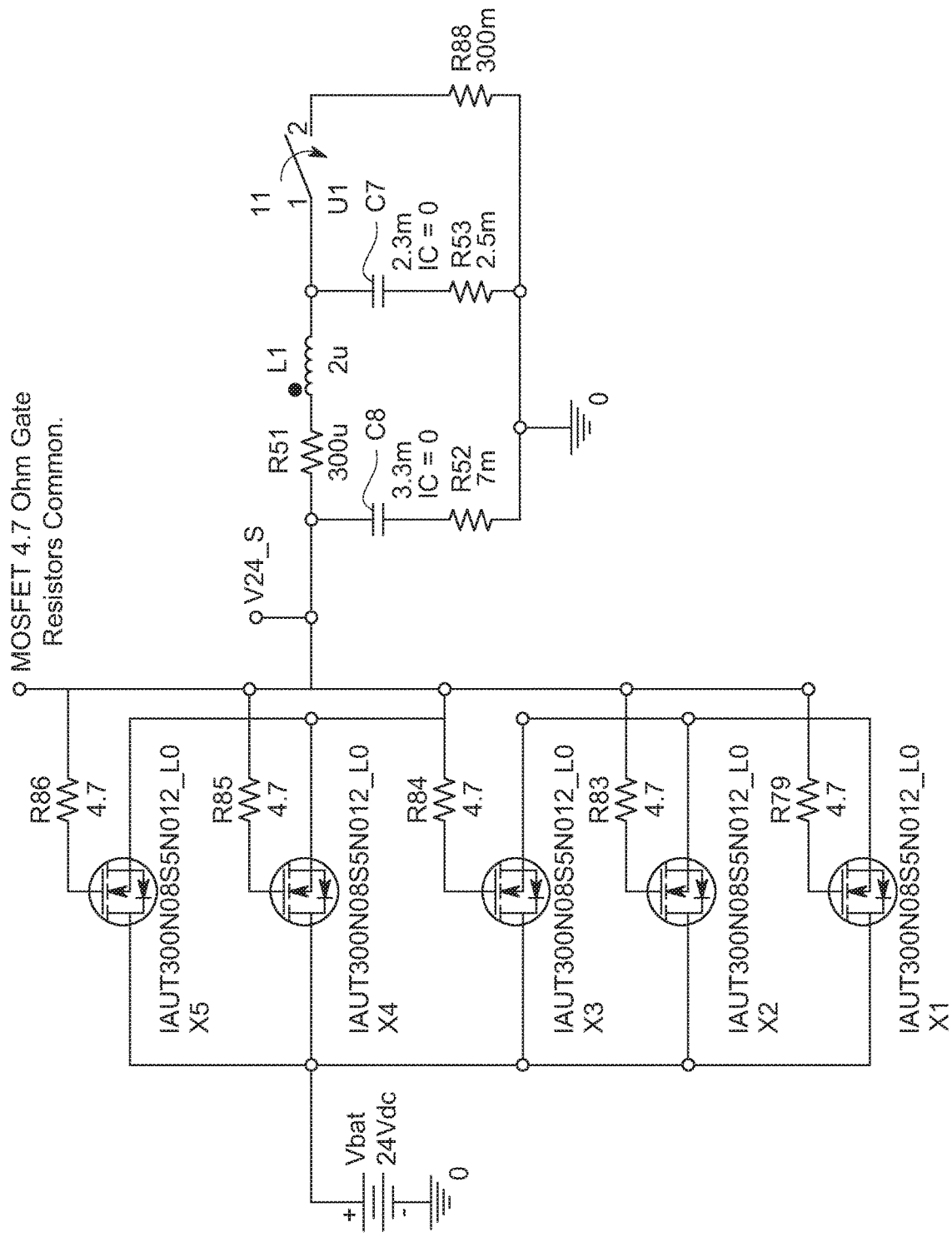
FIG. 5 shows an example in which multiple MOSFETs are used instead of a single switch.

Referring to FIG. 5, in another embodiment, the switch (S1) may include 5 MOSFETs designated as X1-X5. In this embodiment, the power level may be high and the capacitive load to be charged is the sum of C8 and C7, instead of single capacitor (C1).

Figure 6:
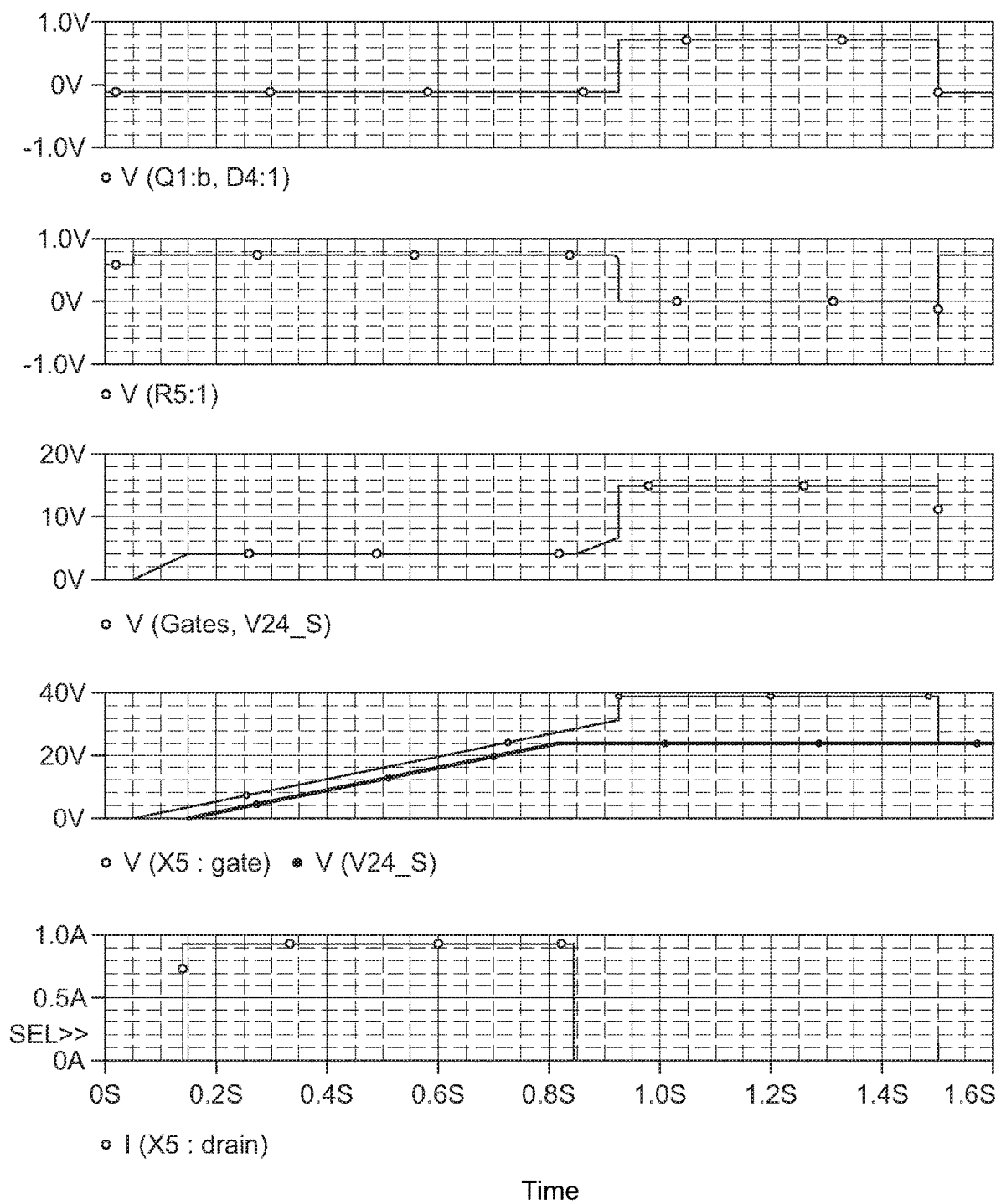
FIG. 6 shows plots of a simulation of a method according to the present invention.

FIG. 6 shows plots resulting from a simulation. The simulation ground was designated as "0". The positive node of the capacitors to be charged was another ground reference and designated as "V24_S". It should be noted that the entire pre-charge control circuit, with the exception of the "Reference dV/dt", rises with the "V24_S" node during the charging process.

In the simulation, X1-X4 (see FIG. 5A) were disabled so the total current could be seen in a single drain. See the bottom plot in FIG. 6.

The second plot from the bottom in FIG. 6 shows the Vg voltage of the switch (S1) and the rising capacitor (C1) voltage relative to ground node "0".

The third plot from the bottom in FIG. 6 shows the Vgs voltage (Vg–V24_S). It should be noted that during the constant drain current of X5, the Vgs of the MOSFET is also a flat line and constant.

The fourth plot from the bottom in FIG. 6 shows the "comparator output" releasing the Reference dV/dt and the Vgs of the plot (third plot from the bottom) rising suddenly.

The top plot in FIG. 6 shows the comparator (U2) inputs changing polarity, which shuts off the comparator (U2) output.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

The invention claimed is:

1. A method of operating a circuit that includes a capacitor and a load that are connectable to a voltage source by an electronically controllable switch, the method comprising charging the capacitor with a constant or approximately constant voltage rate (dV/dt) by raising a voltage across the capacitor from an initial voltage value and at nearly a constant rate by turning the switch on from an off state to a final on state at a predetermined rate controlled by a reference rate set by a reference block to cause the switch to supply current to the capacitor at approximately a constant current according to I=C*dV/dt supply rate that is selected to avoid damage to the switch until, at the final on state, a voltage across the capacitor and the voltage source's voltage are the same, and then operating the switch to supply current from the voltage source to the capacitor when the voltage across the capacitor reaches the voltage source's voltage.

2. The method of claim 1, wherein the switch is a bipolar junction transistor.

3. The method of claim 1, wherein the switch is a MOSFET.

4. The method of claim 3, wherein the gate to ground voltage of the MOSFET is increased according to a predetermined dV/dt rate of the capacitor to turn the switch on from the off state to the final on state according to the predetermined rate.

5. The method of claim 4, wherein the reference block is a Reference dV/dt block connected to increase the gate to ground voltage according to the predetermined dV/dt rate of the capacitor.

6. A method of operating a circuit that includes a capacitor and a load that are connectable to a voltage source by an electronically controllable switch, the method comprising charging the capacitor by raising a voltage across the capacitor from an initial voltage value and at nearly a constant rate by controlling the switch to supply current to the capacitor at approximately a constant current supply rate that is selected to avoid damage to the switch, and then operating the switch to supply current from the voltage source to the capacitor when the voltage across the capacitor reaches the voltage source's voltage, wherein the switch is a MOSFET, wherein the gate to ground voltage of the MOSFET is increased according to a predetermined dV/dt rate to supply current to the capacitor, wherein the circuit further comprises a Reference dV/dt block connected to increase the gate to ground voltage according to the predetermined dV/dt rate, and further comprising comparing a gate to source voltage of the MOSFET (Vgs) to a reference voltage, and disabling the Reference dV/dt block when the Vgs reaches a reference voltage (Vref).

7. The method of claim 6, wherein a comparator compares the Vgs to a Vref and disables the Reference dV/dt block when the Vgs reaches the Vref.

8. The method of claim 6, further comprising increasing the Vgs to a full-on voltage (Von) after disabling the Reference dV/dt block.

9. The method of claim 8, wherein the Vgs is increased by a pull-up resistor connected to another voltage source.

10. The method of claim 9, further comprising disconnecting the voltage source from the capacitor and the load by disabling the MOSFET.

11. The method of claim 10, further comprising operating a disconnection switch to divert current away from the gate of the MOSFET to disable the MOSFET and disconnect the voltage source from the capacitor and the load.

12. The method of claim 11, wherein the current is diverted away from the another voltage source to the capacitor.

13. A method of operating a circuit that includes a capacitor and a load that are connectable to a voltage source by an electronically controllable switch, the method comprising charging the capacitor by raising a voltage across the capacitor from an initial voltage value and at nearly a constant rate by controlling the switch to supply current to the capacitor at approximately a constant current supply rate that is selected to avoid damage to the switch, and then operating the switch to supply current from the voltage source to the capacitor when the voltage across the capacitor reaches the voltage source's voltage, wherein the switch is a MOSFET, wherein the gate voltage of the MOSFET is increased at a predetermined dV/dt rate across the load capacitor while supplying current to the capacitor, wherein the circuit further comprises a Reference dV/dt block connected to increase the gate voltage according to the predetermined capacitor dV/dt rate, and further comprising comparing a gate to source voltage of the MOSFET (Vgs) to a reference voltage, and disabling the Reference dV/dt block when the Vgs reaches a reference voltage (Vref).

* * * * *